(12) United States Patent
Boeve (10) Patent No.: US 7,635,993 B2
(45) Date of Patent: Dec. 22, 2009

(54) DIGITAL MAGNETIC CURRENT SENSOR AND LOGIC

(75) Inventor: Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 552 days.

(21) Appl. No.: 11/596,791

(22) PCT Filed: May 11, 2005

(86) PCT No.: PCT/IB2005/051552

§ 371 (c)(1),
(2), (4) Date: Nov. 16, 2006

(87) PCT Pub. No.: WO2005/114671

PCT Pub. Date: Dec. 1, 2005

(65) Prior Publication Data

US 2008/0205110 A1    Aug. 28, 2008

(30) Foreign Application Priority Data

May 18, 2004    (EP) ............................ 04102193

(51) Int. Cl.
    *G11C 11/15*      (2006.01)
(52) U.S. Cl. ..................... 326/136; 365/158
(58) Field of Classification Search ........... 326/136; 365/5, 171, 173, 158; 324/252
See application file for complete search history.

(56) References Cited

U.S. PATENT DOCUMENTS

| | | | |
|---|---|---|---|
| 5,963,038 A | 10/1999 | De Jong et al. | |
| 6,229,729 B1 | 5/2001 | Lienau | |
| 6,418,048 B1 | 7/2002 | Sin et al. | |
| 6,545,906 B1 | 4/2003 | Savtchenko et al. | |
| 6,859,063 B2 * | 2/2005 | Nuspl et al. .................. | 326/30 |

\* cited by examiner

*Primary Examiner*—Daniel D Chang

(57) ABSTRACT

A sensor for sensing magnetic field strength has a sensor element, and detection circuitry for detecting a level of resistance of the sensor element, the level of resistance varying with magnetic field under test and having hysteresis, so that upon electromagnetic excitation the resistance can switch between two or more stable levels as the magnetic field under test varies. The sensor outputs a digital signal according to the level of resistance. The sensor output may further be interpreted in terms of a change-of-state upon electromagnetic excitation. As the sensor no longer needs a different characteristic from magnetic memory cells, it can be much easier to construct and to integrate with magnetic memory cells than an analog sensor. An excitation signal varies a threshold for the magnetic field under test at which the resistance switches, to enable multiple measurements with different thresholds. Multiple sensor elements can have different thresholds, by having differing geometry or size. It has applications in current sensing, and programmable magnetic logic, when multiple input currents are sensed. Changing the threshold can change the logic operation between AND and OR.

21 Claims, 11 Drawing Sheets

ADDITIVE:

SUBTRACTIVE:

IMPROVED VERSION UNDER 45 DEGREES:
ADDITIVE:                    SUBTRACTIVE:

DIGITAL MAGNETIC CURRENT SENSOR AND LOGIC

This invention relates to digital magnetic field sensors, to current sensors, magnetic logic circuits products and integrated circuits having such sensors, and to corresponding methods of making such sensors and of using such sensors.

It is known to provide on-chip current sensing in systems-on-chip (SoC) and other integrated circuits (IC's). This is also known as a BICS (Built In Current Sensor). Some are described in U.S. Pat. No. 5,963,038, which shows detecting faults in integrated circuits by measurement of current through a conductor in the integrated circuit by means of a sensor situated in the vicinity of the conductor. The sensor can be constructed in various ways so as to measure the field produced by the current through the conductor. Examples disclosed include a Hall sensor, an MR (magnetoresistive) sensor and a GMR (giant magnetoresistive) sensor. This can enable testing of conductors which cannot be accessed easily by external test equipment, or for detecting faults in individual ones of parallel paths which would pass a resistivity test even if only one path was conducting.

An MR sensor has a resistance that is dependent on an external magnetic field through the plane of the sensor. Different types of MR sensors exist. Sensors based on anisotropic magnetoresistance (AMR), have been used in magnetic recording heads for several years. MR sensors have a layer of anisotropical magnetic material and current through this layer is influenced by an external magnetic field, which causes the change in resistance. The GMR (Giant MagnetoResistive) sensor has a layer of magnetic material in a fixed direction and a layer of magnetic material of which the magnetic direction can be influenced by an external magnetic field, which causes the change in measured resistance. Depending on the type and construction, an MR sensor is more sensitive in one direction and less sensitive in another direction in the plane of the sensor.

When combining sensing and memory technology in a single material stack, a trade-off must be made between the main parameters for both technologies. Whereas the performance of (analog) sensor technology is represented in parameters such as linearity, range, being hysteresis-free, etc., a memory technology has rather contradictory requirements such as, most importantly, a stable hysteresis curve. One option would be to rotate memory elements over 90 degrees, to form a so-called crossed anisotropy between the preferential magnetization axes of free and hard layer, to linearize the sensor characteristics. This solution is however limited to a particular conventional configuration of MRAM stack. Motorola has developed a different MRAM solution that is particularly suited for a memory technology, but that is less suited for analog sensing solutions as well. A magnetic sensor based on this technology yields only small signals for small fields so that in practice only larger fields can be measured. In conclusion, it remains questionable at present, whether both technologies can be merged together into a single platform combining the memory and sensing functionalities.

It is also known to use magnetic switching properties for logic devices. Several types of magnetic logic devices have been proposed in the past, all of which are based on the 2D switching properties of MR elements such as magnetic tunnel junctions. However, all options so far rely on the state of the logic device that may comprise one or more magnetic tunnel junctions. The logic function can be defined by either the chosen reference, or by inducing a particular preset state. Examples can be found in [1] Black et al, *Programmable logic using giant-magnetoresistance and spin-dependent tunneling devices*, J. Appl. Phys. 87, 6674-6679 (2000), and [2] Richter et al, *Field programmable spin-logic based on magnetic tunneling elements*, J. Magn. Magn. Mater. 240, 127-129 (2002). It was proposed to form a programmable spin-logic element by altering the switching threshold of a MR element, or by combination of several MR elements, respectively. This functionality can further be combined in a single element with two independent input lines, by an additional addressing ('set') procedure to induce a preset magnetic state that gives a selection between AND and OR gates [Ney et al, *Programmable computing with a single magnetoresistance device*, Nature 425, 485-87 (2003)].

A fundamental limitation of all proposals is that the switching characteristics of the devices need to be interpreted in order to make a decision on functionality and the output. To be more specific, Richter et al use two different reference levels to distinguish between the AND and OR functionality, whereas Ney et al use a different preset state to distinguish between states. The magnetic history of the sample will define the measured state or output that can be high or low, e.g. <1> or <0>. All methods use two input lines for the logic variables A and B.

It is an object to provide improved apparatus, especially sensors such as digital magnetic field sensors, current sensors, magnetic logic gates and integrated circuits having such sensors, as well as methods of manufacture or operation of the same.

According to a first aspect, the invention provides:

There is a sensor for sensing magnetic field strength. The sensor comprises a sensor element, and detection circuitry for detecting a resistance of the sensor element, the level of resistance varying with the magnetic field under test; the variation of the level of resistance of the sensor element has hysteresis, so that upon electromagnetic excitation the resistance can switch between two or more stable levels, as the magnetic field under test varies, and the sensor outputs a digital signal according to the level of the resistance. The sensor output may further be interpreted in terms of a change-of-state upon electromagnetic excitation.

Such a digital sensor has a number of advantages. As it no longer needs a different characteristic from magnetic memory cells, it can be much easier to construct and to integrate with memory cells than an analog sensor. It is particularly suitable for applications such as testing or monitoring, where it is necessary to know if a magnetic field under test has exceeded a given threshold value. In this case, compared to an analog sensor, the output circuitry can be simplified to e.g. a comparator and threshold signal, whereas a 'complicated' amplifier would be required for a sensitive analog sensor. In case of the present invention, the readout function of MRAM can be reused, in the form of e.g. a comparator in combination with a threshold signal. In MRAM a dedicated reference can be deduced from a set of reference cells identical to memory cells.

As additional optional features, the sensor has circuitry for initializing the level of resistance before sensing, the sensor has circuitry for providing at least one electromagnetic excitation signal to the sensor element, or the sensor has means for varying a threshold value for the magnetic field under test, at which the resistance switches. This can be used to improve measurement precision. It can be achieved by a sequence of measurements with different thresholds, or by having multiple sensor elements, the multiple sensor elements having different thresholds for the magnetic field under test, e.g. by having differing geometry or size. The sensor may have circuitry for mode selection and change between different modes of electromagnetic excitation for switching up or down levels. This relates to MRAM including mode selection, which is polarity-dependent and hence based on the state of the sensor. Alternatively the sensor may have circuitry for providing a same electromagnetic excitation signal for switching up or down levels, which relates to a toggle-concept where there is no polarity dependence. The sensor can be arranged to detect a polarity of the field. It can be arranged to switch if the magnetic field exceeds a threshold value, or switch if the magnetic field is below a threshold value. It can also be arranged to compare the level of resistance to a preceding level of resistance, and output a digital signal according to the comparison. It can also be arranged to compare the threshold value for the magnetic field under test to a preceding threshold, and output a digital signal according to the comparison. In this case, the sensor tracks the magnetic field under test by comparing the threshold with preceding values, and giving a logic output for increasing/decreasing magnetic field.

Another aspect of the invention provides:

A current sensor having the magnetic field sensor set out above, where the current is generating the magnetic field under test, and any of the preferred features.

Another aspect of the invention provides:

An integrated circuit having the magnetic field sensor or the current sensor. Additionally, the integrated circuit can have magnetic memory elements. These can have the same configuration as the sensor element.

Another aspect of the invention provides:

A magnetic logic circuit having two or more input conductors, for carrying currents representing logic inputs, and having the above current sensor for sensing the currents, the output value of the sensor representing a result of a logical operation on the inputs. According to the present invention, the sensor or logic gate measures a change in state upon triggering. The sensor output is interpreted in terms of a change-of-state upon electromagnetic excitation.

This can enable logic circuits to be created which can be manufactured more easily if they can share the same structure as magnetic memory for example. In principle, it can be used with any type of magnetic sensor element configuration.

As an additional feature, the sensor has circuitry for providing an electromagnetic excitation signal. This provides the digital sensor with a (background) magnetic field level of the magnetic field under test as caused by the input conductors or of a background magnetic field, which magnetic field level can be directly related to a threshold value for the total magnetic field under test to result in switching. By varying the level of the electromagnetic level, the type of the logical operation can be changed between AND and OR type operations, or combinations of these. This can enable a programmable logic circuit which can be programmed at run time, in the field, and need not suffer the delays of prior art devices, caused by needing to induce a preset state. Nor is there any need for the extra complexity of providing different reference levels for each circuit, for different logic operations. This can enable simpler, faster programmable logic, which could have widespread application. The circuit can be an integrated circuit, and can include magnetic memory elements. The sensor element can also be configured as a Savchenko-type or toggle-type MRAM cell, as known from U.S. Pat. No. 6,545,906. An advantage of this is that identical excitation pulses can be applied to switch between high and low states. The bidirectionality required for conventional MRAM type cells is no longer required. Thus the circuitry for generating these pulses can be simpler.

Other aspects of the invention include corresponding methods of making such sensors or circuits, and methods of sensing.

How the present invention may be put into effect will now be described with reference to the appended schematic drawings. Obviously, numerous variations and modifications can be made without departing from the spirit of the present invention. Therefore, it should be clearly understood that the embodiments of the present invention are illustrative only and not intended to limit the scope of the claims.

The features of the invention will be better understood by reference to the accompanying drawings, which illustrate preferred embodiments of the invention by way of examples. In the drawings.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

To introduce the description of embodiments of the invention, some principles of operation and known principles will be explained. A first solution relates to adding a digital magnetic field sensor to MRAM memory technology. The digital magnetic field sensor is comparable to an electronic flip-flop. In other words, a 'magnetic' flip-flop is disclosed. One of the useful applications lies in the field of IC (integrated circuit) testing, where sensor technology is required for power-pin testing. In current IC's, multiple parallel power connections are made to the chip. However, due to the parallelism, faulty connections cannot be detected with simple means. A straightforward way to do power-pin testing would be an enabler for robust IC testing. The digital sensor proposed here is able to detect that a particular current level is present or not. The sensor principle is based on the fact that the (extra) magnetic field caused by the current line under test is able to discriminate between a change of state of the digital magnetic sensor or not, when the 'flip-flop' is being triggered. In other words, a change-of-state can be detected, or not.

This digital sensor technology is therefore fully compatible with any MRAM technology that may be developed, so that digital magnetic sensors can be integrated along with MRAM technology in any IC. There is no need for extra cost involved due to extra process steps, or extra masks. A single magnetic stack deposition can be used for patterning memory cells, as well as digital magnetic sensors. Furthermore, all required electronic circuitry can be identical to that one used for writing and reading of MRAM cells, so that there is no need for extra burden in the design effort. Last but not least, the new functionality can be implemented along with existing boundary scan test methodology, or in a built-in self-test (BIST).

Figure 1:
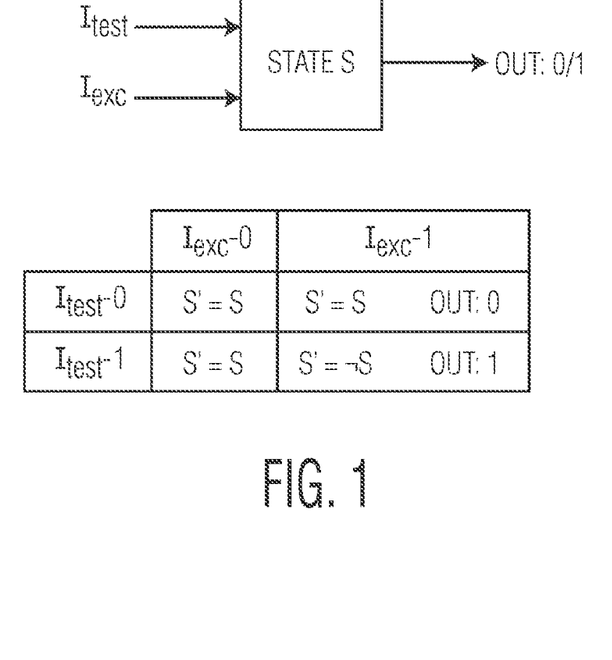
FIG. 1 shows a schematic representation of a digital magnetic sensor according to an embodiment.

FIG. 1 shows a schematic representation of the digital magnetic sensor according to an embodiment of the present invention. The current under test $I_{test}$ is 'compared' with an electromagnetic excitation signal in the main block. As an example, an excitation current $I_{exc}$ is chosen. Based upon both signals $I_{test}$ and $I_{exc}$, the state S of the digital magnetic sensor can be changed into the complementary state (S' denotes a new state). After an excitation operation, the state of the digital sensor can be measured to give a logic output.

Figure 2:
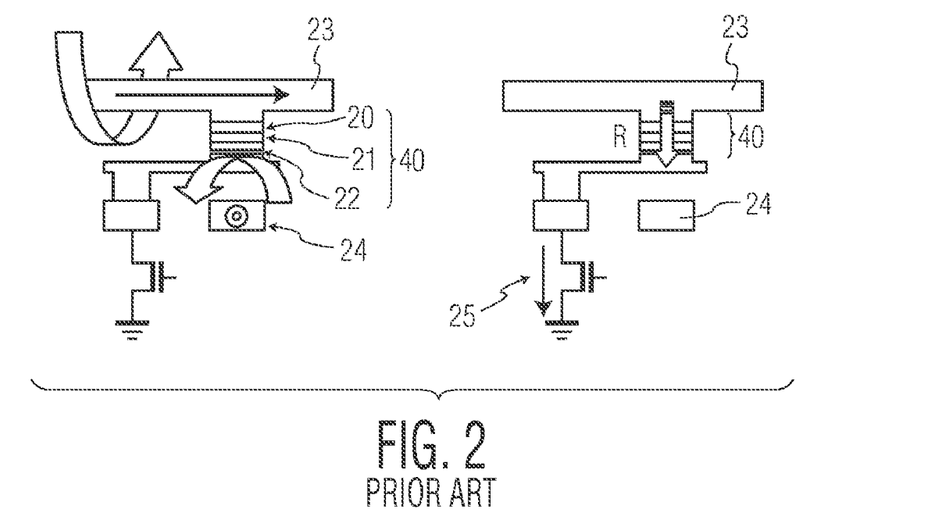
FIG. 2 shows a conventional MRAM.
Figure 3:
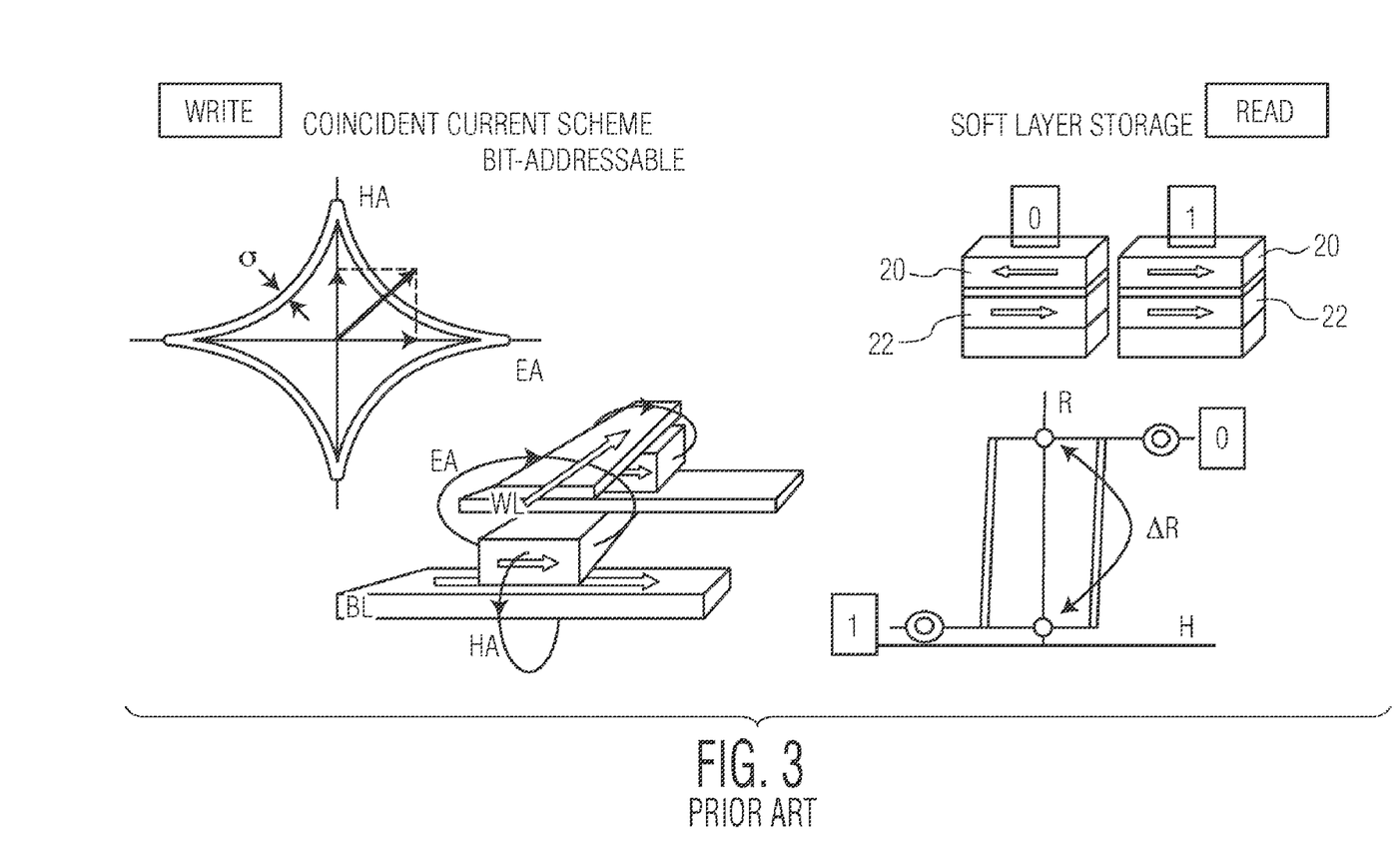
FIG. 3 shows characteristics and operations of a conventional MRAM.

FIGS. 2, 3: Conventional MRAM Write and Read Operation

FIG. 2 shows operating principles (write operation on the left hand side and read operation at the right hand side of FIG. 2) for a 1T-1MTJ MRAM architecture. This structure and how to manufacture it is well known and need not be described again in detail here. To summarise, such a TMR-based MRAM contains cells which are magnetic tunnel junctions (MTJs). MTJs basically contain a free magnetic layer 20, an insulating layer (tunnel barrier 21), a pinned magnetic layer 22 and an antiferromagnetic layer which is used to "pin" the magnetization of the pinned layer 22 to a fixed direction. The magnetic tunnel junction has two stable magnetization states, which can be addressed using arrays of bit lines 23 and word lines 24. At zero magnetic field, the stable magnetization states, i.e. parallel and anti parallel alignment of the free storage layer 20 with respect to a reference layer 22, have a large difference in resistance. Reading is done through a series transistor 25 to avoid sneak currents through other elements in the memory matrix. During a write operation, the bit state can be changed in a local magnetic field, generated by currents in the bit lines 23 and word lines 24. Note that two magnetic field components are used to differentiate between the selected bit and other elements.

The switching curve of an element can be represented by its so-called astroid curve as shown in FIG. 3 (upper left). The astroid curve unambiguously separates switching and non-switching events. In other words, if a field is being applied within the astroid, elements will not switch and maintain their magnetization state, whereas fields exceeding the astroid may switch the element, if the previous state were the opposite one. Therefore, only if two magnetic field components are present, the bit state can be switched.

FIG. 3 also shows write and read strategies for conventional MRAM, in which the information is stored in the magnetization direction of the soft layer. During a write operation, bit-addressability is provided in the coincident current scheme as depicted in the astroid curve of the soft layer 20. Information is read by resistance, which basically compares the magnetization state in the soft layer 20 and hard layer or reference layer 22.

Figure 4:
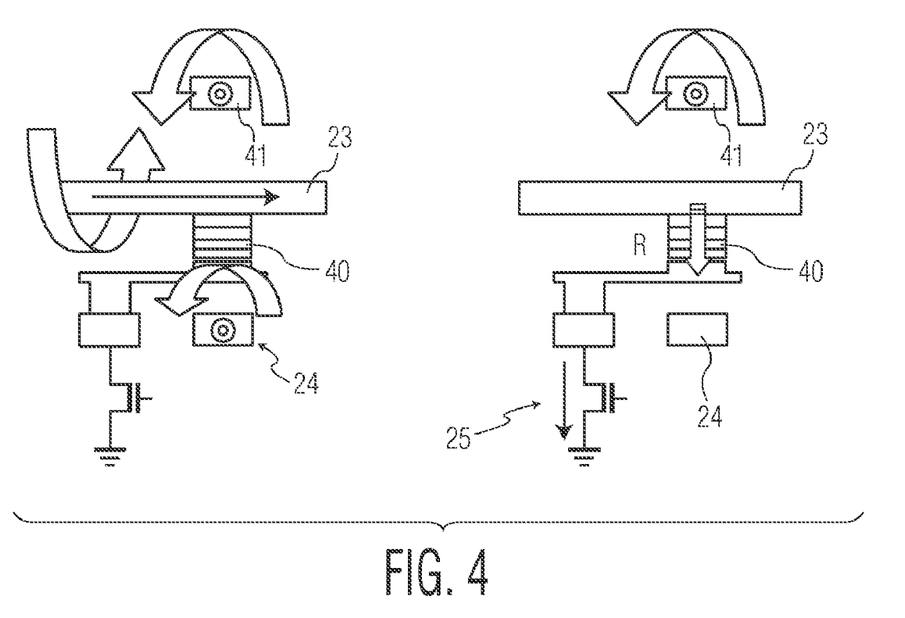
FIG. 4 shows a digital magnetic sensor according to an embodiment.
Figure 5:
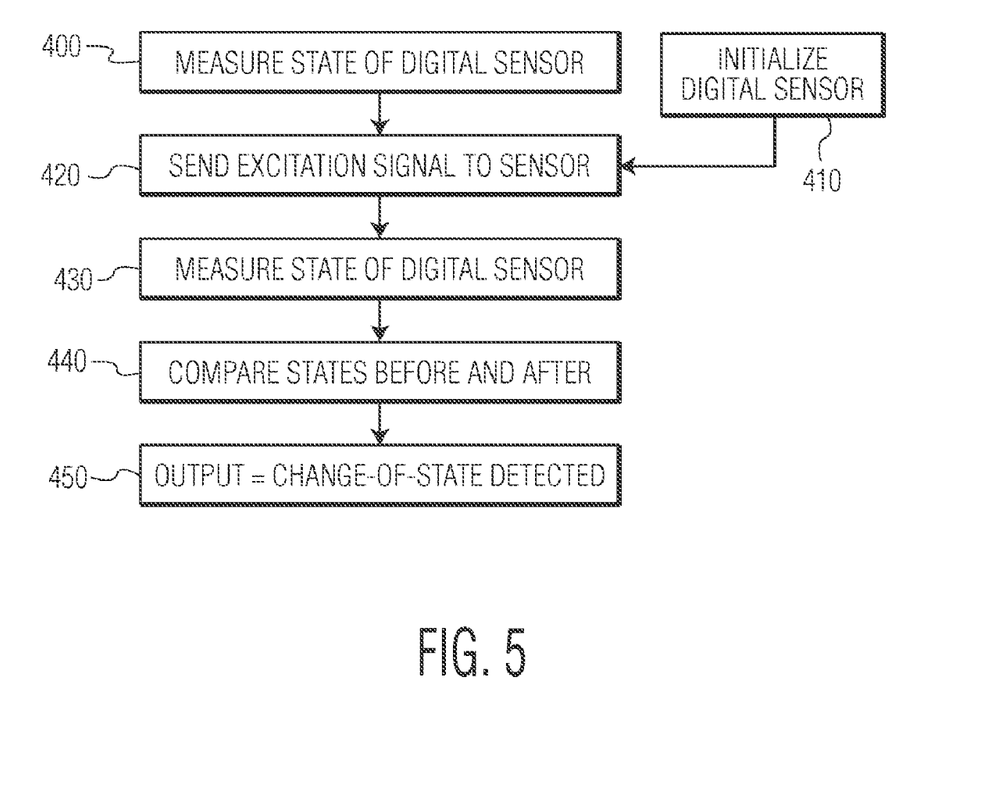
FIG. 5 shows a measurement procedure for a digital magnetic sensor according to an embodiment.

FIGS. 4, 5: The Digital Magnetic Sensor Operation According to an Embodiment of the Present Invention A digital magnetic sensor according to embodiments of the invention can be based on a magnetic device identical to those used in the MRAM array. The magnetic sensor is therefore very small, and able to measure the presence of currents in the smallest lines on chip, as shown in FIG. 4. The left hand side of FIG. 4 illustrates sensor excitation, and the right hand side of FIG. 4 illustrates a sensor read operation. The magnetic sensor is activated by a write-like operation on the cell, hence by the presence of a local magnetic field during sensor excitation. A successful write operation may indicate that an extra magnetic field caused by the current in a current line 41 under test is present, or alternatively, that this current is not present. The state of the digital magnetic sensor is read from the magnetization state in the magnetic element 40. The read operation is equal to any read operation for MRAM technology. Note however that the measured voltages representing logic-0 and 1 values may depend on the extra magnetic field that may be present. A dedicated reference element or circuit can be used to compare the state of the magnetic element 40 of the digital magnetic sensor with the reference. The schematic in FIG. 5 gives an overview of an example of the measurement procedure. An initial state of the digital sensor is measured first at step 400. If necessary at step 410, the sensor is initialised. This can involve a complete writing procedure. The reading starts by sending an electromagnetic excitation signal to the sensor element at step 420. At step 430, the state of the sensor is measured by reading the resistance. At step 440, a comparison is made with a previous state to see if it has changed or toggled. A logic output at step 450 is dependent on the output of the comparator.

Different embodiments are now described. A first embodiment has a digital magnetic sensor that consists of a single magnetic element 40 that is identical to MRAM memory cells, including the position with respect to bit lines 23 and word lines 24. In other words, the magnetic sensor is in essence identical to a single cell from the memory array. In addition, an extra magnetic field may be generated in a current line 41 under test that is located in a different conductive layer, e.g. metal layer, depending on whether the current line 41 under test is carrying a current or not. Ideally a conductive layer is chosen that is adjacent to the conductive layers used for the memory array, i.e. the metal layers for bit lines 23 and word lines 24 connecting the digital magnetic sensor.

Two modes of operation can be used: (1) an additive mode, when the extra magnetic field from the current in the current line 41 under test is present, the cell in the digital sensor can change its state, or (2) a subtractive mode, when the extra magnetic field from the current in the current line 41 under test is present, the cell in the digital sensor cannot change its state. The terms additive and subtractive relate to the fact that along one field component, magnetic fields are added up, or subtracted, depending on the sign of the two fields in play. A combination of both modes can be implemented in the final circuitry. A more detailed description is given below.

EMBODIMENT 2

A second embodiment describes a digital magnetic sensor that consists of a single magnetic element that is identical to MRAM memory cells. However, contrary to Embodiment 1, the current under test is provided in either the bit line 23 or word line 24. The state of the digital sensor can be changed if both field components are present, of which one is generated by the current under test. For details, see below.

Measurement procedure: MRAM devices can be switched within a matter of nano-seconds. Anticipated pulse durations of the excitation pulses are therefore identical to MRAM operation. The measurement procedure comprises different steps. Firstly, the state of the digital sensor is read, which results in a logical value 0 or 1. This is followed by electromagnetic excitation of the digital sensor with one or more excitation pulses, in principle currents. Note that amplitude and direction of the excitation pulse may be a consequence of the original logical state of the digital sensor, amongst others a consequence of symmetry in the switching curve. In another embodiment, the initial state of the digital sensor may be set in a preferred orientation, which is however not trivial when a static field is present during a write operation. After excitation, the state of the digital sensor is read again. The output of the complete building block is a logical value 0/1 indicating that the current under test is present, or not.

A multitude of variations on this theme are included within the scope of the present invention. A few examples are given as follows:

(1) Cells in the digital sensor can have a different geometry or size compared to cells in the MRAM array, to make them suited to measure a particular current level. Furthermore, this allows the measurement of different current levels on one IC.

(2) A single digital magnetic sensor module may comprise several magnetic cells that can be different from one another, in order to improve the correctness of operation, or to be able to discriminate between different levels.

(3) The measurement procedure can be made more complex, e.g. to allow for multiple excitation and read operations, before a decision is made with respect to the presence of current in the current line 41 under test.

(4) Magnetic digital sensors that are able to detect current/no current were described so far. A reasonably straightforward extension is to include the detection of the sign of a current with fixed amplitude but change in polarity.

(5) The current line 41 under test can be aligned along the orientation of bit line 23 or word line 24, but alternatively under 45 degree direction (see further—for Embodiment 1 only). This can improve the stability against erroneous half-selects in conventional MRAM cells. Note that this is not limited to a particular angle.

Figure 6:
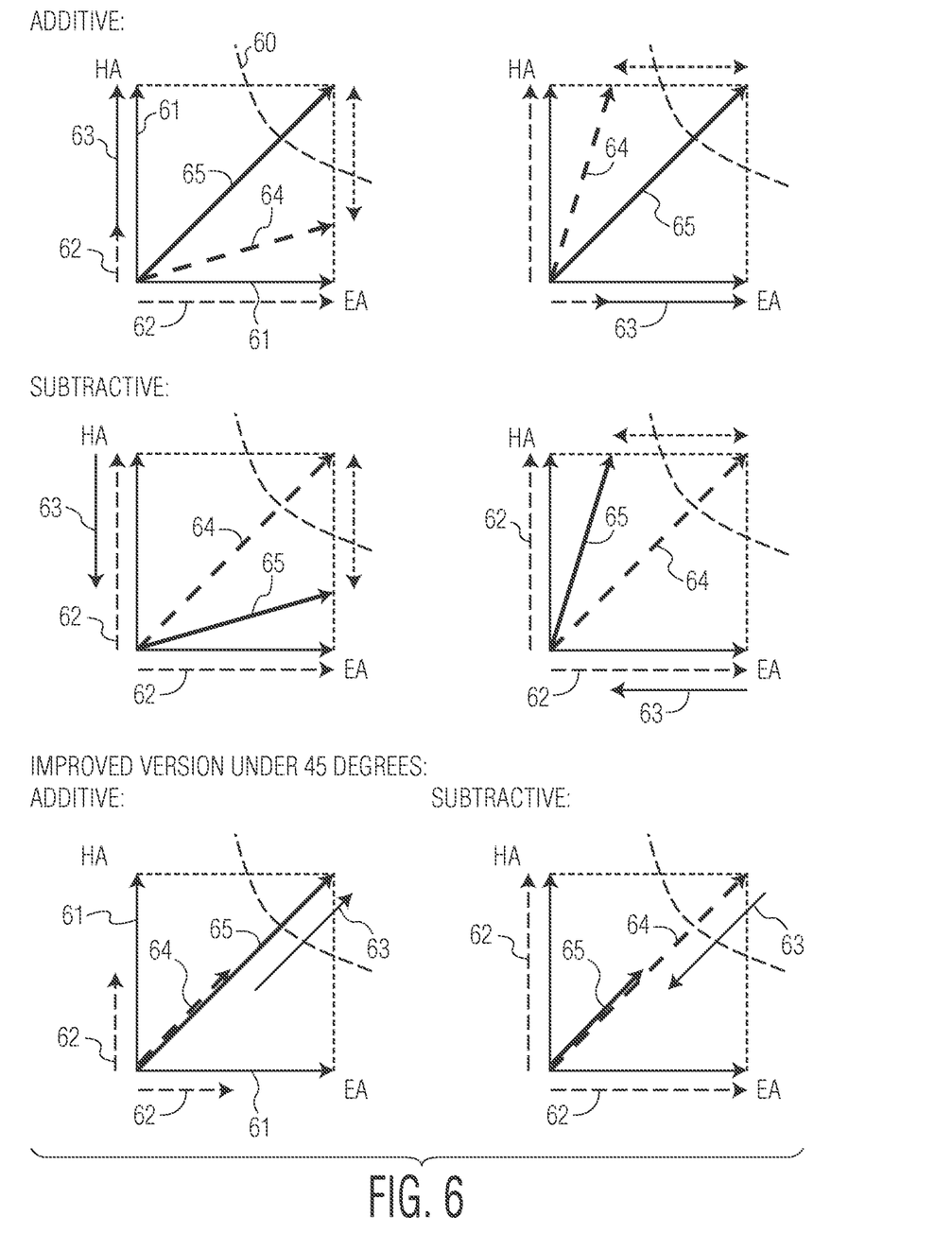
FIG. 6 shows graphs of characteristics and operation of a sensor according to an embodiment.

FIG. 6: Detailed Description of Embodiment 1

Based on the first embodiment, the magnetic cell in the digital magnetic sensor can be based on the conventional MRAM memory cell, or the more advanced Savchenko cells introduced by Motorola in U.S. Pat. No. 6,545,906. The state of the cell is initially read, for example it is in the parallel state, which resembles a logic-0. Note that the read operation is performed in a possible presence of the extra magnetic field that is generated in the current line 41 under test. However, this will not influence the read operation when properly designed. The sensor cell is then exposed to the electromagnetic excitation signal, which resembles the standard write operation for a magnetic memory cell, depending on the technology used. In both technologies, two field components are provided to the memory cell, in the form of two independent current pulses with a particular timing. When exciting the digital sensor cell, one of these field components will be aligned in the same direction as the extra field generated in the current line 41 under test (assuming that the current line 41 is oriented either along bit line 23 or word line 24).

The additive and subtractive modes of operation will now be explained. In the first case (additive mode), there is switching of the magnetization state in the element 40 when the sum of the extra magnetic field and the corresponding electromagnetic excitation pulse is sufficiently high. In other words, only when a current is present in the current line 41 under test, is there switching. In the second mode (subtractive mode), the extra magnetic field and the corresponding electromagnetic excitation pulse have opposite signs, so that only in absence of the extra magnetic field, is there switching. When current is present in the current line 41 under test, one of the magnetic field components is too small to cause switching. Note that in the first case, the system should be engineered in such a way that the sum of both currents is the target current for a reliable write operation. In order to avoid a stringent half-select issue [However note that the half-select problem is not as severe as for data retention in MRAM arrays, moreover one is no longer restricted to a write operation under 45 degrees for conventional MRAM.], the discriminating component from the current line 41 under test should be more or less as large as the corresponding electromagnetic excitation pulse for additive operation in the ideal scenario. In other words, the discriminating component from the current line 41 under test should be more or less half of the total magnetic field component required for a reliable MRAM write operation in the ideal scenario. Also, in the second mode of operation, the discriminating component from the current line 41 under test should be (at least) half of total magnetic field component required for a reliable MRAM write operation. Note that the additive mode inherently requires lower current levels in the electromagnetic excitation signal, leading to lower power consumption.

An improved version with better half-select robustness for the conventional MRAM-type is to realign the current line 41 under test under 45 degrees with respect to the memory cell layout, in such a way that the complete electromagnetic excitation field is enhanced, or reduced, in additive and subtractive mode, respectively.

FIG. 6 gives an overview of the different modes disclosed in this Embodiment. The first pair of graphs at the top are for an additive mode, with the line 41 under test aligned with the hard axis (HA) (left hand side of the drawing) and with the easy axis (EA) (right hand side of the drawing) respectively. The second pair of graphs are similar but are for a subtractive mode of operation of the digital magnetic sensor conforming to Embodiment 1. The third pair at the bottom, represent an improved version with the current line 41 under test under 45 degrees. The dashed line 60 indicates the magnetic field that needs to be overcome for switching that is part of the so-called astroid curve. Solid arrows 61 indicate 'standard' MRAM write operations. Dashed arrows 62 indicate the magnetic field components from the electromagnetic excitation signals, whereas the solid arrow 63 indicates the extra magnetic field that may be generated in the current line 41 under test. In both modes, the thick dashed arrow 64 indicates the resultant magnetic field during excitation when no current is present in that line 41 under test. The thick solid arrow 65 indicates the resultant magnetic field when current is present in the line 41 under test.

The switching threshold 60 is drawn for conventional MRAM, however, the basic sketches would also be valid for the so-called Savchenko-type MRAM. Given the different astroid curve for this second type of memory, the 'normal' additive or subtractive modes would probably be preferred. When the possible magnetic field from the current line 41 under test is aligned along the hard axis, only then, depending on the initial logical value of the digital magnetic sensor, the direction of the excitation pulse can be varied for a conventional memory cell, assuming that in this technology only the hard axis direction is fixed. As a consequence, the sign of the easy-axis excitation field component needs to be changed for a different initial logical value. In all other cases, at first sight, pre-defined magnetic elements would be required, so that the measurement procedure starts with a standard MRAM write operation. However, since it is uncertain whether the current line 41 under test is carrying a current, in most cases, it will be more difficult to write the magnetic elements in a pre-defined state with a single current level, opposite to that possible field. This would require a larger current level, so that the whole system may become over-dimensioned. Alternatively a current source with multiple levels or a variable current source may be adequate.

Figure 7:
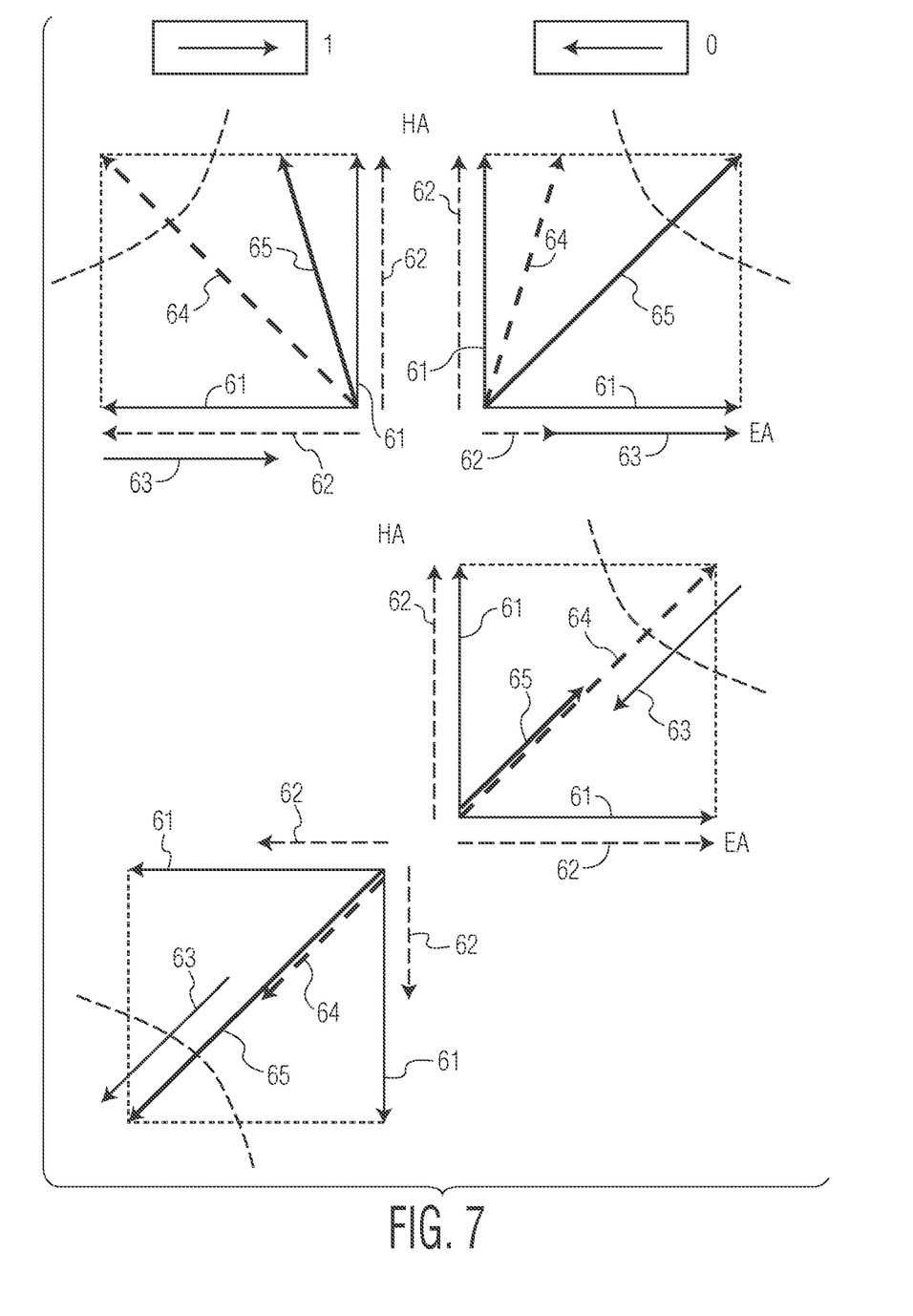
FIG. 7 shows an example of mode switching for a sensor according to an embodiment.

FIG. 7: Mode Switching

Another solution lies in the concept of 'mode-switching'. FIG. 7 shows an example of mode-switching in order to avoid the need for pre-set elements. When the current under test would lead to a magnetic field component in the direction of the easy axis, mode-switching can be used. The principle is shown in FIG. 7 for two selected examples: (1) for the magnetic field under test along the easy axis, in the top two graphs and (2) for the magnetic field under test along the 45-degree axis in the lower two graphs. In the first example, for an initial logic-0, the additive mode is used, whereas for a logic-1, the subtractive mode is used. In the second example, it is the other way around. When changing the corresponding modes, the opposite sign of the possible field can be measured, or in other words, the opposite current direction.

Different kinds of current sources can be used to deliver the necessary excitation pulses. For conventional MRAM, in the case of the possible field along the hard-axis, there is a need for one fixed field pulse in the hard-axis direction (unipolar), and a bipolar current source in the easy axis. In other words, this is identical to the needs for MRAM write. In the first example with mode-switching however, a bipolar current source with two different pulse amplitudes is needed along the easy axis. And when the possible current from the current line 41 under test is aligned under 45 degrees, there is a need for two bipolar current sources with two different pulse amplitudes, one each along the easy and hard axes. In other words, the more robust system would require a more complex excitation scheme. For the toggle-type MRAM configuration, rather than bipolar current sources, unipolar ones are sufficient. Given the nature of this switching concept, the subtractive modes seem to be the preferred way of implementation. No mode switching is required.

Figure 8:
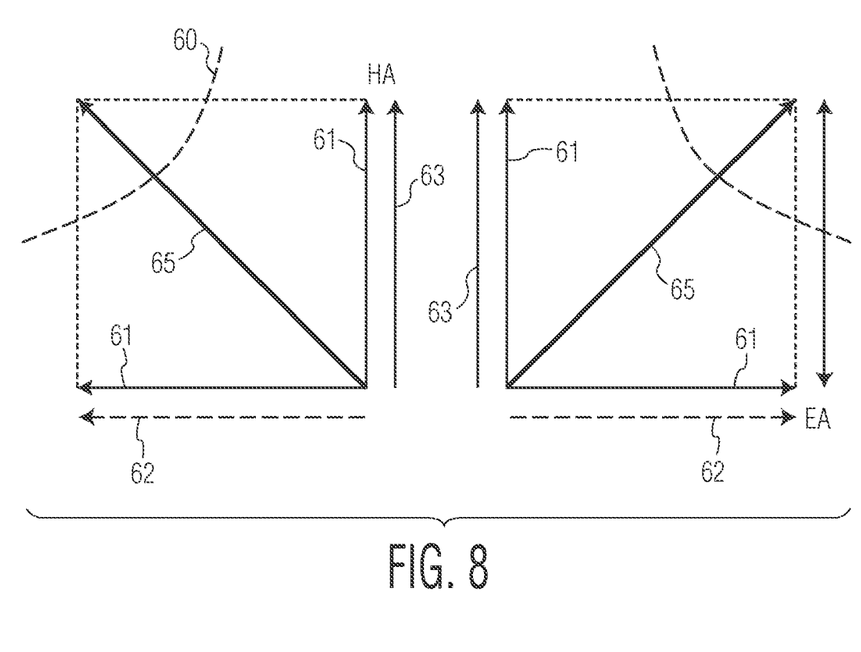
FIG. 8 shows another example according to an embodiment for which the current under test is oriented to affect the hard axis magnetic field.

FIG. 8: Detailed Description of Embodiment 2:

FIG. 8 shows operations of a digital magnetic sensor corresponding to Embodiment 2. The notation is identical to that of previous figures. In Embodiment 2, the current line 41 under test is delivering the hard-axis component of the magnetic element. Since in total only two current lines are present in this embodiment, a current line 41 under test resulting in a field with an easy-axis component is no longer an option. FIG. 8 gives the schematic representation of the magnetic fields that are generated, for an initial logic-0 or 1 value. Greyscales and line stiles etc. in the graph are analogous to those used in FIGS. 6 and 7. Due to the hard-axis field that may be present due to the current in the line 41 under test, the difference between logic-0 and 1 value will depend on the magnetic field, since the magnetization may be under an angle to the easy-axis. It is to be noted that there is no longer a restriction to a total write field that is oriented under 45 degrees. Given the simplicity of the concept, Embodiment 2 may be the preferred mode of operation for conventional MRAM. It is less suitable for the toggle-type MRAM devices.

A digital magnetic sensor has been described that is suited for measuring the presence of a magnetic field. The magnetic field can be an external magnetic field, but can also be a local magnetic field generated in a current line 41 under test. An immediate application would be on-chip power-pin testing (current/no current). The sensor is fully compatible to all MRAM technologies, and can be added at virtually no cost.

As described, the embodiments are limited to observing the presence of a current under test that is larger than a certain threshold value above which one is able to unambiguously detect a current. In other words, there is no information on the size of the current, or variations in that current, e.g. due to aging. This would be useful for applications such as power-pin testing, where the different parallel 10 pins that deliver power to the chip need to be tested, before operation, and if possible during the lifetime of the chip. A scenario is the occurrence of open contacts, either before, or during the lifetime of the chip, that result in the current no longer being present in one of the contacts, in combination with an increased current in other pins. To 'measure' changes in the size of a current being measured more accurately, rather than performing a single measurement, the sensor is exposed to a particular measurement pattern, from which extra information on the current level, and changes with time can be deduced. The change in current is deduced from a change in switching probability in the sensor. Alternatively, arrays of sensor can be implemented for averaging purpose.

Theoretical Background for Variable Measurements

Without being limited by theory, switching of magnetic elements is related to the Arrhenius-Néel formalism for thermal activation over a single energy barrier. For a given element with two stable energy minima, the transition rate for relaxation from the local minimum to the global minimum over an energy barrier $\Delta E$, is given by $$\gamma(\Delta E) = \tau_0^{-1} \exp(-\Delta E/k_B T) \quad (1)$$

in which $\tau_0$ denotes the attempt time for reversal, typically $\tau_0 = 1$ ns. In the exponential, the Boltzmann factor is found as the product of the Boltzmann constant $k_B$ and the temperature T.

For a set of $N_0$ identical magnetic elements, the number of bits $N(t)$ that have not switched after a time t are given by the rate equation $dN(t)/dt = -N(t)/\tau(\Delta E)$, where $\tau(\Delta E)$ is the characteristic reversal time dependent on the size of the energy barrier $\Delta E$ ($H_{EA}, H_{HA}$) that is magnetic field dependent. The solution is the exponential $$N(t) = N_0 \exp(-t/\tau(\Delta E)) \quad (2)$$

The probability that an element is switched, as function of time, yields $$P(t) = \frac{N_0 - N(t)}{N_0} = 1 - \exp(-t/\tau(\Delta E)) \quad (3)$$

Using the definition for the transition rate γ for relaxation over an energy barrier $$\gamma(\Delta E) \equiv \frac{1}{N}\frac{dN}{dt}, \quad (4)$$

the characteristic reversal time can be calculated as $$\tau(\Delta E) = \tau_0 \exp(\Delta E/k_B T) \quad (5)$$

During a write operations in MRAM, or when exciting the digital current sensor, electromagnetic current pulses with a specific pulse duration $t_s$ are applied. The energy barrier that can be overcome for such a pulse length can be calculated by mapping the pulse duration $t_s$ on the characteristic reversal time. The probability for switching in the time interval $[0, t_s]$, $P(t_s)$, is then equal to 63%, when $$t_s \cong \tau_0 \exp(\Delta E/k_B T) \quad (6)$$

$$\text{or}: \Delta E = k_B T \ln\left(\frac{t_s}{\tau_0}\right)$$

Remember that the energy barrier that can be overcome for a given pulse duration $t_s$ depends on the magnetic field. For a single current pulse (in a fixed assisting hard axis field), the energy barrier can be related to the current that is generating the magnetic field using $$\Delta E(I) = a\left(1 - \frac{I}{I_{SW}}\right)^2 \quad (7)$$

where $I_{sw}$ is the intrinsic switching current in the absence of thermal effects, and a is a constant.

In other words, if the pulse time is fixed to realistic times in the nano-second regime, e.g. 10 ns, the energy barrier that can be overcome during that time can be related back to the effective field being present during the pulse. In these embodiments, the field is a combination of (1) the 2-D magnetic field generated using two orthogonal pulses, and (2) the extra field that is created in the current line under test.

Practical Realization

Figure 9:
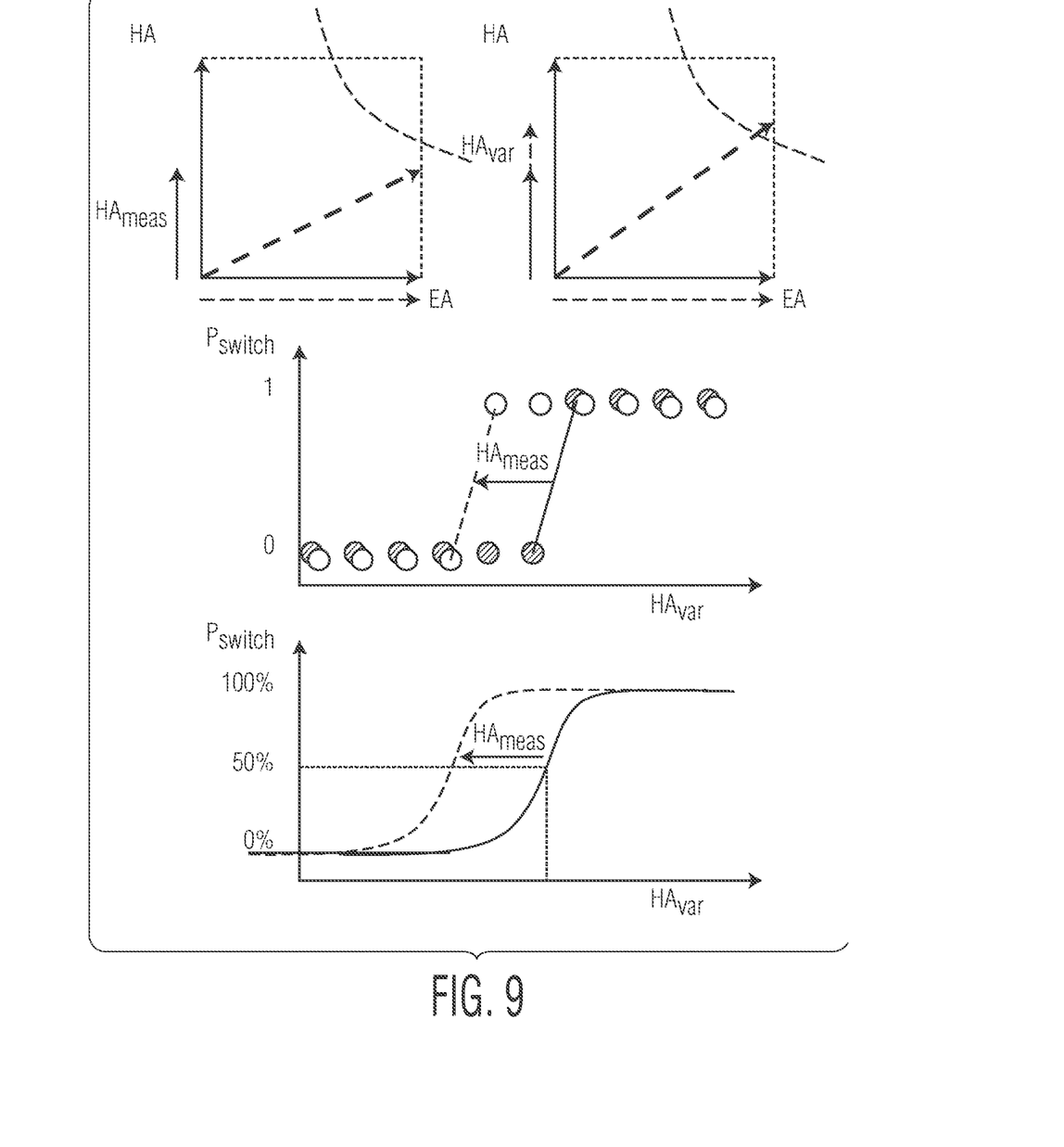
FIGS. 9, 10 and 11 show graphs for a measurement procedure using many excitation pulses of different level to give different switching thresholds for the magnetic field under test.

In FIG. 9, the measurement procedure is shown for the so-called additive mode. FIG. 9 shows in the first pair of graphs at the top, the hard (HA) and easy (EA) axis magnetic field vectors with and without the current under test. The middle graph shows a time sequence of the output with varying pulse amplitude along the hard axis. For a single pulse train with varying pulse amplitude the sensor will flip its state at a certain value for $HA_{var}$, which depends on the presence of the hard-axis field to measure, i.e. $HA_{meas}$, as well as on its size. The solid black and open white data points and curves indicate the shift in $HA_{var}$ upon the presence of a field $HA_{meas}$. In an improved version (below), a statistical analysis of a number of pulse trains may lead to an improved output for the sensor as shown in the lower graph of FIG. 9.

For a single pulse train with increasing amplitude, the magnetic element will start to switch from a particular pulse amplitude onwards, depending on the level of the extra magnetic field $HA_{var}$ that is being created in the current line under test. This amplitude depends on the presence of the hard-axis field to measure, i.e. $HA_{meas}$, as well as on its size. This is represented in FIG. 9 by the shift of the black data points or solid curve into the white data points or dashed curve, that is triggered by (1) the presence and (2) the size of the extra magnetic field. Note that, for clarity, the pulse train is made of separate 'write' operations, which each comprise two pulses with proper timing with respect to each other. Only the amplitude of one of those pulses is varied, in the example in FIG. 9, the component that leads to a magnetic field in the hard-axis direction. When multiple pulse trains are taken into account, a statistically averaged switching probability versus pulse amplitude can be obtained for the magnetic element. The required accuracy and range can be obtained by proper choice of the discrete levels in the pulse train, and the number of cycles.

In a different embodiment a multitude of magnetic elements that are all exposed to the same pulses, and/or extra fields can be used. In other words, rather than (or as well as) spreading the measurement in time by using a repetitive measurement scheme on a single cell, averaging over different elements by read-out of separate cells is carried out which will lead to similar statistics. Moreover, all cells can be combined into a single cell (by means of a parallel/series combination) resulting in a single output voltage that yields a statistical value between voltages representing 0% and 100% switching. A 50% threshold is shown in the lower graph of FIG. 9.

Combinations of the two above-mentioned principles can be envisaged, e.g. the field $HA_{var}$ dependence is measured on a single (or multiple) array(s) of magnetic elements. Averaging can be obtained by repeating the measurement a number of times.

EXPERIMENTAL EXAMPLE

Figure 10:
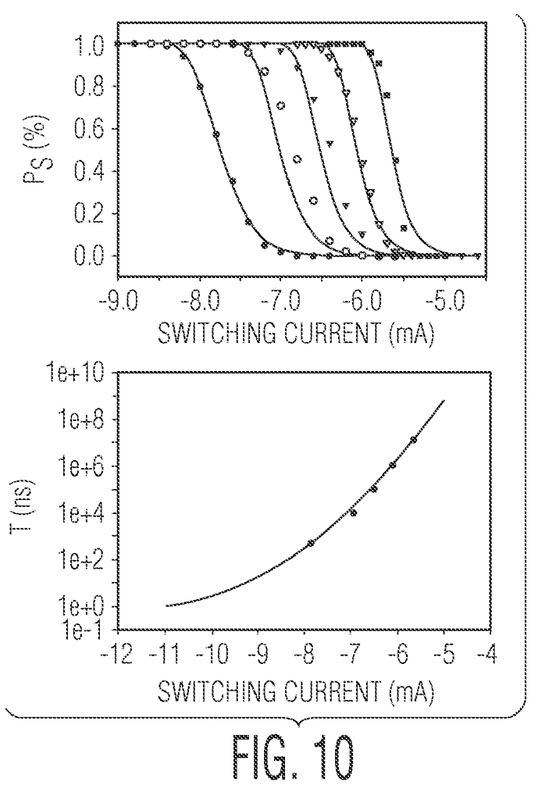

FIG. 10 shows experimental data from a larger magnetic element, where a single-domain switching event on (part of) the element was measured and analysed in a statistical manner. Current pulses with increasing amplitude were applied to the device, in a fixed assisting field. Different curves for different pulse duration $t_p$ are shown. The left hand graph shows switching probability as a function of the pulse current amplitude in mA. Each data point is the result of 100 pulses at I for a given pulse time $t_p$. The solid lines are exponential fits to the data. From right to left, the pulse times for each line are respectively 10 ms, 1 ms, 100 μs, 10 μs, and 1 μs.

The right hand graph of FIG. 10 shows the relationship in Equation (7) between the current pulse amplitude I, and the characteristic reversal time τ. The solid line is fitted to the data points that were defined by using the fact that $t_p = \tau$ when $P_s = 63\%$ (Equation (6)).

Figure 11:
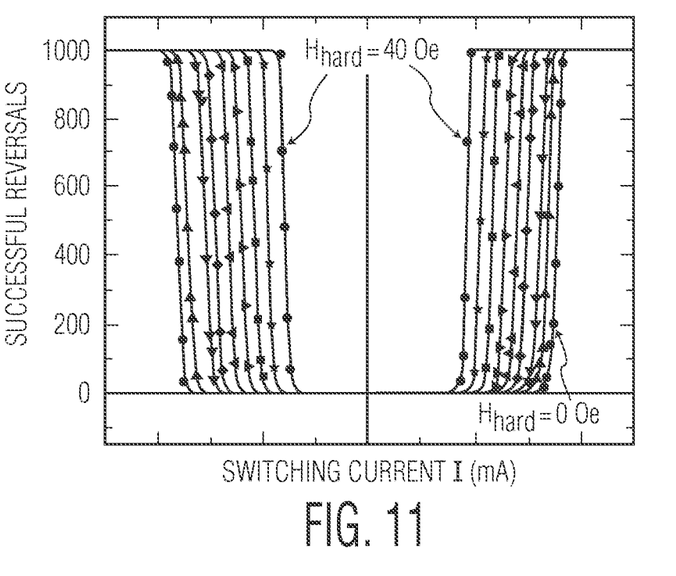

FIG. 11 shows another data set for thermally activated switching in actual MRAM cells [from Rizzo et al, Appl. Phys. Lett. 80, 2335-37, 2002]. The number of successful reversals out of 1000 field pulses of duration $I_p = 20$ ns is plotted against applied current I for free layer of 0.4×1.3 μm magnetic tunnel junction. Each set of data is for a different hard axis field ranging from 0 to 40 Oe. The solid lines are fits to Equation (2), in combination with Equations (5) and (7).

In actual fact, the hard axis field is indeed used to lower the easy axis current required for switching. Note the sharp transition from 0% to 100% switching for the different hard axis fields. In other words, extra information can be retrieved from repetitive measurements, in the sense that a change in measured probability can be linked to a change in the magnetic environment of the device.

To summarise, embodiments described include repetitive measurements on a single sensor, or alternatively sensor arrays that are exposed to a multitude of pulses. An immediate application would be on-chip power-pin testing. This feature is fully compatible with ail MRAM technologies, and can be added at virtually no cost.

Figure 12:
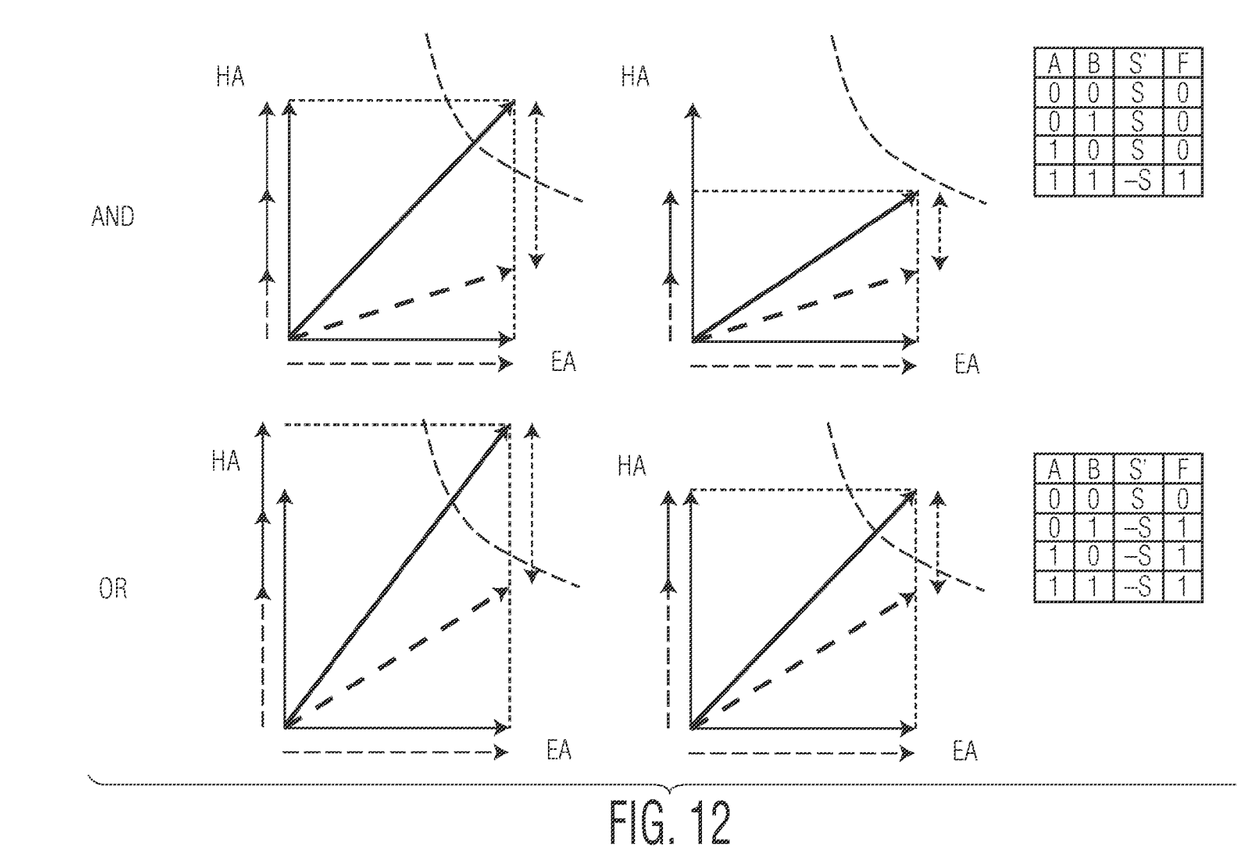
FIG. 12 shows graphs for operation of magnetic logic.

FIG. 12: Magnetic Logic

Magnetoresistance (MR) elements may offer enhanced logic abilities compared to the rigid architecture of transistor-based logic elements where the functionality is fixed by the wiring. Reprogrammable magnetic logic devices are currently a hot topic in the field of magnetism. The principles described above in relation to magnetic field sensing can be applied to magnetic logic. The sensor principle is based on the fact that a (extra) magnetic field is able to determine between a change of state of the digital magnetic sensor or not, when triggered. In other words, a change-of-state can be detected, or not. The trigger function is a short excitation pulse that is in principle identical to the program operation that is used in MRAM. The sensor itself can be an MRAM element.

This concept can be generalized for multiple inputs, i.e. magnetic fields that are caused by e.g. a current line. This is illustrated in FIG. 12, for the so-called additive mode. Several other variations can be envisaged.

In the example of FIG. 12, it is assumed that a total field H is required in the hard axis (HA) for switching, in combination with a certain fixed component in the easy axis (EA). For the AND function we assume that the excitation pulse in the hard axis is only H/3, whereas the component in the easy axis is identical to the standard program pulse. When the input variables A and B each have currents leading to an extra magnetic field of size H/3 at the sensing element, then the presence of both variables will result in a change-of-state, whereas only one of them, or none, is not sufficient to result in a change-of-state. As a matter of fact, this is a realization of the AND function of the variables A and B. To change the logic cell into the OR function, the excitation pulse in the hard axis is changed to approximately 2H/3, so that one of the variables A or B is sufficient to induce a change-of-state when the logic cell is electromagnetically excited.

NAND and NOR functions can be realized by a different interpretation of the change-of-state. In other words, the NAND function is the AND function where a logic <1> represents no-change-of-state. This logic can be implemented in the toggle-MRAM concept. An advantage of this concept is that identical excitation pulses can be applied to switch between high and low states; the bidirectionality required for conventional MRAM is no longer required. Therefore, a change-of-state detection principle is preferred.

The different logic functions can be further adapted by including a preset state (Table 1), so that a possible change-of-state during excitation results in an output that directly reflects the logic output, i.e. <0>=Low R, <1>=High R. A preset state 0/1 results in the AND/NAND function for a 'low' excitation pulse as shown in FIG. 12, whereas a preset state 0/1 results in the OR/NOR function for a 'high' excitation pulse.

| A | B | Output State | Preset 0 | Preset 1 |
|---|---|---|---|---|
| 0 | 0 | S | 0 | 1 |
| 0 | 1 | S | 0 | 1 |
| 1 | 0 | S | 0 | 1 |
| 1 | 1 | ¬S | 1 | 0 |
|   |   |   | OR | NOR |
| 0 | 0 | S | 0 | 1 |
| 0 | 1 | ¬S | 1 | 0 |
| 1 | 0 | ¬S | 1 | 0 |
| 1 | 1 | ¬S | 1 | 0 |
|   |   |   | AND | NAND |

So far input current lines yielding a similar magnetic field direction were assumed. Other functions such as a logic EXOR function can be realized by including the polarity dependence of the current. The EXOR function is <0> for same inputs and <1> for different inputs. An example of implementation is by using two parallel current lines A and B with different current direction, oriented such as to create a hard axis component in the digital magnetic sensor. This example would be comparable to the geometry used in FIG. 12 for logic AND and OR gates. As a result, with both current levels identical (current or no current) the resultant field at the digital magnetic sensor will be practically zero. For only one of both currents being present, an adequate hard axis magnetic field component can be realized that is sufficient to assist the electromagnetic excitation pulse to switch the digital magnetic sensor. It is to be noted that timing issues may arise when the raising and falling edges of input and excitation signals would overlap.

Figure 13:
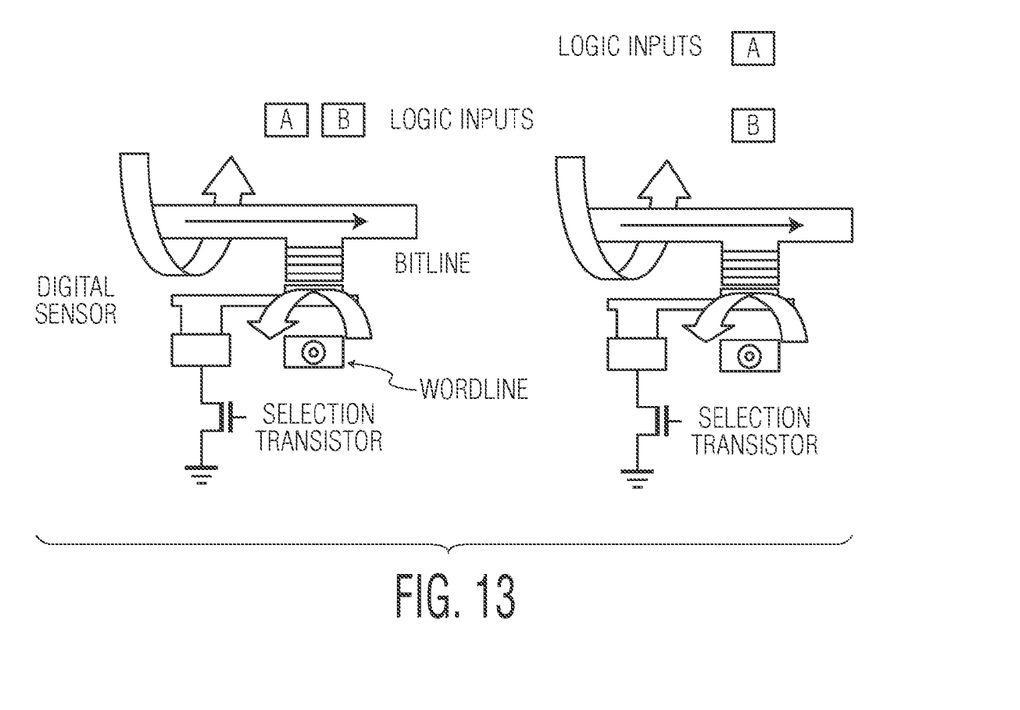
FIG. 13 shows a digital magnetic sensor according to an embodiment.

The variables A and B can be two different input lines, that can be either parallel to each other, or orthogonal, or even under a certain angle such as 45 degrees. Two examples of implementation, however not limiting, are given in FIG. 13. Furthermore those input lines can be placed on top of and/or below the MRAM cell including the program and read lines, i.e. the digital sensor. Given the fact that the MRAM functionality is built into the CMOS back-end, the adjacent metal layers can be used to provide the input logic signals, representing variables A and B, in the form of currents at either of two levels. In general, more than two input current lines can be considered, as well as multiple current levels or polarities in the different lines.

CONCLUDING REMARKS

As has been described above, a sensor for sensing magnetic field strength has a sensor element, and detection circuitry for detecting a resistance of the sensor element, the resistance varying with magnetic field under test and having hysteresis, so that upon electromagnetic excitation the resistance can switch between two or more stable levels as the magnetic field under test varies. The sensor outputs a digital signal according to the resistance. The sensor output can be further interpreted in terms of a change-of-state upon electromagnetic excitation. As the sensor no longer needs a different characteristic from magnetic memory cells, it can be much easier to construct and to integrate with magnetic memory cells than an analog magnetic sensor. An electromagnetic excitation signal varies a threshold for the magnetic field under test, at which the resistance switches, to further enable multiple measurements with different thresholds. Multiple sensor elements can have different thresholds, by having differing geometry or size. It has applications in current sensing, and programmable magnetic logic gates, when multiple input currents are sensed. Changing the electromagnetic excitation signal, hence the threshold, can change the logic operation between AND and OR.

Other variations can be conceived by those skilled in the art within the scope of the claims.

The invention claimed is:

1. A sensor for sensing strength of a magnetic field under test, comprising:
   a sensor element, and
   detection circuitry for detecting a level of resistance of the sensor element, the level of resistance varying with the magnetic field under test,
   wherein the variation of the level of resistance of the sensor element has hysteresis, so that upon electromagnetic excitation the resistance can switch between two or more stable levels, as the magnetic field under test varies, and the sensor outputs a digital signal according to the level of resistance.

2. The sensor of claim 1, arranged to compare the level of resistance to a preceding level of resistance and output a digital signal according to the comparison.

3. The sensor of claim 1 having circuitry for initializing the level of resistance before sensing.

4. The sensor of claim 1, having circuitry for providing at least one electromagnetic excitation signal to the sensor element.

5. The sensor of claim 4, having circuitry for mode selection and change between the different modes of electromagnetic excitation for switching up or down levels of resistance.

6. The sensor of claim 4, having circuitry for providing a same electromagnetic excitation signal for switching up levels or down levels of resistance.

7. The sensor of claim 1, having means for varying a threshold for the magnetic field under test at which the resistance switches.

8. The sensor of claim 1, arranged to make a series of measurements with different thresholds for the magnetic field under test.

9. The sensor of claim 1, having multiple sensor elements, the multiple sensor elements having different thresholds for the magnetic field under test.

10. The sensor of claim 9, the multiple sensor elements having differing geometry or size.

11. The sensor of claim 1, arranged to detect a polarity of the magnetic field under test.

12. The sensor of claim 1, arranged to switch if the magnetic field under test exceeds a threshold, or switch if the magnetic field under test is below a threshold.

13. A current sensor having the sensor of claim 1 arranged to sense the magnetic field caused by a current in a conductor.

14. A magnetic logic circuit having two or more input conductors, for carrying currents representing logic inputs, and having a current sensor as set out in claim 13 for sensing the currents, the output value of the sensor representing a result of a logical operation on the inputs.

15. The circuit of claim 14, the current sensor having circuitry for providing an electromagnetic excitation signal which can be varied to alter the type of the logical operation.

16. The circuit of claim 15 arranged to use the same electromagnetic excitation signal for switching up or down levels.

17. The circuit of claim 14, the logical operation comprising any of AND, OR, NAND or NOR operations, or combinations of these.

18. An integrated circuit having the current sensor of claim 13.

19. The integrated circuit of claim 18, having integrated random access magnetic memory elements.

20. An integrated circuit comprising the magnetic logic circuit as recited in claim 14 and using CMOS layers for the sensor element, and adjacent metal layers for the conductors for the logic inputs.

21. An integrated circuit comprising the current sensor as recited in claim 13.

* * * * *